US007960894B2

(12) United States Patent
Duru

(10) Patent No.: US 7,960,894 B2
(45) Date of Patent: Jun. 14, 2011

(54) GENERATOR FOR EXCITING PIEZOELECTRIC TRANSDUCER

(75) Inventor: Nicolas Duru, Paris (FR)

(73) Assignee: L'Oreal S.A., Paris (FR)

( * ) Notice: Subject to any disclaimer, the term of this patent is extended or adjusted under 35 U.S.C. 154(b) by 284 days.

(21) Appl. No.: 11/822,662

(22) Filed: Jul. 9, 2007

(65) Prior Publication Data

US 2008/0088202 A1 Apr. 17, 2008

Related U.S. Application Data

(60) Provisional application No. 60/833,805, filed on Jul. 28, 2006.

(30) Foreign Application Priority Data

Jul. 7, 2006 (FR) ...................................... 06 52876

(51) Int. Cl.
*H01L 41/09* (2006.01)

(52) U.S. Cl. ...................................................... 310/317

(58) Field of Classification Search ............. 310/316.01, 310/316.02, 316.03, 317, 318
See application file for complete search history.

(56) References Cited

U.S. PATENT DOCUMENTS

| | | | | |
|---|---|---|---|---|
| 3,904,896 | A | 9/1975 | Guntersdorfer | |
| 4,689,515 | A | 8/1987 | Benndorf et al. | |
| 4,901,034 | A * | 2/1990 | Frank-Peter | 331/4 |
| 5,164,992 | A | 11/1992 | Turk et al. | |
| 5,518,179 | A | 5/1996 | Humberstone et al. | |
| 5,588,592 | A * | 12/1996 | Wilson | 239/4 |
| 5,661,359 | A * | 8/1997 | Katsuragawa | 310/316.01 |
| 6,296,196 | B1 * | 10/2001 | Denen et al. | 239/4 |
| 6,402,046 | B1 | 6/2002 | Löser | |
| 2002/0129813 | A1 | 9/2002 | Litherland et al. | |

FOREIGN PATENT DOCUMENTS

| | | | |
|---|---|---|---|
| EP | 0 123 277 | A2 | 10/1984 |
| EP | 0 219 693 | A1 | 4/1987 |
| FR | 2 802 836 | A1 | 6/2001 |
| JP | 6-254455 | | 9/1994 |
| KR | P1997-0060927 | | 8/1997 |
| KR | P1998-082154 | | 11/1998 |
| KR | P2000-0050405 | | 8/2000 |
| KR | P2000-0061100 | | 10/2000 |
| WO | WO 00/51747 | | 9/2000 |
| WO | WO 00/53337 | | 9/2000 |

OTHER PUBLICATIONS

French Search Report for FR 0652876, dated Apr. 17, 2007.

(Continued)

*Primary Examiner* — Derek J Rosenau
(74) *Attorney, Agent, or Firm* — Finnegan, Henderson, Farabow, Garrett & Dunner & L.L.P.

(57) ABSTRACT

A generator for exciting a piezoelectric transducer, includes at least one digital processor unit. The digital processor unit is configured to operate at least in an iterative operation stage including more than two successive iterations. Each iteration includes: exciting the transducer at a plurality of frequencies in a frequency band about a set-point frequency; during transducer excitation, acquiring one or more values related to at least one electrical magnitude associated with the excitation of the transducer for a plurality of frequencies in the frequency band; and analyzing the values acquired to determine a new set-point frequency for a subsequent iteration.

27 Claims, 3 Drawing Sheets

OTHER PUBLICATIONS

English language abstract of EP 0 123 277 A2, Oct. 31, 1984.
English language abstract of JP 6-254455, Sep. 13, 1994.
Sung Uk Lee et al., "Real-Time Facial Feature Detection for Person Identification System", IAPR Workshop on Machine Vision Application, Nov. 2000, 4 pages, Tokyo, Japan XP-002340583.
Bernd Heisele et al., "Feature Reduction and Hierarchy of Classifiers for Fast Object Detection in Video Images", Proceedings of the IEEE Computer Conference on Computer Vision and Pattern Recognition, Dec. 8, 2001, pp. II-18 to II-24, vol. 1 of 2, IEEE Comp. Soc. US, Los Alamitos, CA, XP-010584095.
Leonardo C. Topa et al., "Edge Detection and Thinning in Time-Varying Image Sequences Using Spatio-Temporal Templates", Pattern Recognition, 1989, pp. 143-154, vol. 22, No. 2, Pergamo Press plc, Great Britain, XP-002340584.
N. Bassiou et al., "Frontal Face Detection Using Support Vector Machines and Back-Propagation Neural Networks", Proceedings 2001 International Conference on Image Processing, Oct. 7-10, 2001, pp. 1026-1029, vol. 1 of 3, Conf. 8, IEEE, U.S., XP-010565037.
Gabor, "*Eye Detection Based on Gabor Transforms*", Journal of Circuits and Systems, Dec. 2001, vol. 6, No. 4.
Heisele, Bernd et al., "*Feature Reduction and Hierarchy of Classifiers for Fast Object Detection in Video Images*", Proceedings of the IEEE Computer Conference on Computer Vision and Pattern Recognitions, Aug. 21, 2001, Los Alamitos, CA, IEEE.
Topa, Leonardo C., et al., "*Edge detection and thinning in time-varying image sequences using spatio-temporal templates*", Pattern Recognition, 1989, Abstract only, vol. 22, Issue 2.

* cited by examiner

GENERATOR FOR EXCITING PIEZOELECTRIC TRANSDUCER

This application claims benefit of U.S. Provisional Application No. 60/833,805, filed Jul. 28, 2006, the contents of which are incorporated herein by reference. This application also claims benefit of priority under 35 U.S.C. §119 to French Patent Application No. FR 06 52876, filed Jul. 7, 2006, the contents of which are also incorporated herein by reference.

The present disclosure relates to a generator for exciting a piezoelectric transducer, e.g. a transducer for atomizing a liquid.

BACKGROUND

Generators for exciting piezoelectric transducers may be used, for example, to diffuse a fragrant substance, for example, a perfume. In some instances, the transducer may be excited at a particular frequency where it is desired to obtain a suitable energy efficiency. This may be particularly useful when the generator is powered by an energy source, such as a battery or a rechargeable battery, from which it is desired to minimize the power consumption.

By way of example, the frequency may be a resonant frequency or an anti-resonant frequency, and it can vary as a function of various operating parameters, such as, for example, temperature, aperture size associated with a diaphragm, and/or the rheological characteristics of the liquid to be atomized.

It is thus known to seek to servo-control the excitation of frequency of the transducer by measuring an electrical magnitude associated with its operation, so as to keep the excitation frequency as close as possible to the optimum frequency.

Atomizer devices including a relatively complex analog circuit for servo-controlling the excitation frequency are known from U.S. Pat. No. 3,904,896 and Japanese patent document No. 06-254 455.

U.S. Pat. No. 4,689,515, European patent document No. 0 123 277, and U.S. Application Publication No. 2002/0129813 describe atomizer devices including digital processor units that respond to variation in an electrical magnitude associated with the operation of the transducer in order to keep the excitation frequency at an optimum value.

International publication No. WO 00/51747 describes an atomizer device in which the excitation frequency of the transducer varies as a saw tooth over a predefined frequency band while the excitation voltage decreases exponentially.

French patent application FR 2 802 836 describes another atomizer device. During an initial stage, a search is made for an optimum excitation frequency. This search is performed initially by sweeping through a relatively broad frequency band extending from 1.7 megahertz (MHz) to 1.9 MHz, with a frequency step-size of 10 kilohertz (kHz). The frequency is determined by analyzing the magnitude of the excitation current. Once the frequency value has been determined, a frequency sweep is performed using a step-size of 1 kHz to determine the optimum excitation frequency more accurately, using the same criterion. Thereafter, during a subsequent stage of operation, excitation is performed at the determined frequency, except when certain characteristics of the excitation current exceeds predefined limit values. It can be difficult to measure the value of the excitation current.

Therefore, it may be beneficial to further improve generators for atomizer devices so as to benefit from an atomizer device that presents characteristics that are satisfactory in terms of atomization and in terms of power consumption, while still being relatively inexpensive to fabricate. Further, benefits may be obtained from a generator for an atomizer device in which the transducer is excited in such a manner as to extend its lifetime.

The invention may satisfy some or all of these needs.

SUMMARY

In the following description, certain aspects and embodiments will become evident. It should be understood that the invention, in its broadest sense, could be practiced without having one or more features of these aspects and embodiments. It should be understood that these aspects and embodiments are merely exemplary.

In one exemplary aspect, as embodied and broadly described herein, the invention may provide a generator for exciting a piezoelectric transducer, e.g., a transducer for atomizing a liquid. The generator may include at least one digital processor unit configured to operate at least in a stage of iterative operation comprising more than two successive iterations. Each iteration may include exciting the transducer at a plurality of frequencies in a frequency band about a set-point frequency; during transducer excitation, acquiring one or more values related to at least one electrical magnitude associated with the excitation of the transducer for a plurality of frequencies in the frequency band; and analyzing the values acquired to determine a new set-point frequency for a subsequent iteration.

In at least some embodiments of the present invention, the transducer may be powered with high probability that during each iteration the transducer is excited at a frequency close to the frequency for which atomization efficiency is optimized, e.g., the resonant or anti-resonant frequency, as desired.

In accordance with at least some embodiments, exciting the transducer at a frequency close to the optimum frequency during each iteration may be sufficient to obtain a desired atomization result. Thus, at least some embodiments of the invention may enable efficient operation of the transducer while minimizing or eliminating continuous excitement at the resonant or anti-resonant frequency.

In one aspect, frequency may be varied over the frequency band during an iteration by sweeping from one extreme frequency value of the band to the other, e.g., starting from a low frequency value and going to a high frequency value, and passing through a set-point value. In some alternative embodiments, frequency variation during an iteration may be performed in random manner within the frequency band.

Frequency variation may take place about the set-point value that corresponds, for example, substantially to the middle of the frequency band defined by the high and low frequency values.

The electrical magnitude values measured during an iteration may include a voltage and/or a current. Acquiring a voltage, and in particular a voltage across the terminals of the transducer, may simplify manufacture of the device compared with acquiring a current.

The electrical magnitude values measured during each iteration may be acquired for all of the frequencies in the frequency band. Thus, each excitation frequency may correspond to a measured value of the electrical magnitude.

The digital processor unit may be configured to generate an excitation signal for the transducer in pulse form. The excitation signal may be applied to a power stage connected to the transducer.

The generator may be configured in such a manner that during an iteration, at each frequency in the band, at least one burst of multiple pulses at said frequency is emitted by the digital processor unit. In some embodiments, a burst of pulses may comprise 50 to 250 pulses, for example. The duration of each burst of pulses may lie in the range of 10 microseconds (μs) to 100 milliseconds (ms), for example. Two bursts of pulses may be separated by an idle period of duration lying in the range of 10 μs to 100 ms, for example. A single iteration may comprise two bursts of pulses at the same frequency. A single iteration may also comprise bursts of pulses having the same number of pulses, the duration of a burst being determined by counting the pulses, for example.

The generator may also be configured to operate with an initial stage of operation prior to operating with the iterative operation stage.

The values of the measured electrical magnitude may be analyzed at least in part during the dead period during which the transducer is not excited, for example, during a dead period between the current iteration during which the values were acquired and the following iteration. This may make it possible to accept a slower speed of calculation for the digital processor unit, and thus to reduce its costs.

The analysis of the values may include determining, for each iteration, an extremum of the electrical magnitude, in particular a maximum, which may correspond approximately to the resonant or anti-resonant frequency.

The digital processor unit may be configured to compare the extremum as determined in this way with a reference value, and depending on the results of the comparison, to perform either a new iteration of the iteration operation stage about the set-point frequency determined at the preceding iteration, or else an initialization stage during which the generator is configured to:

excites the transducer at a frequency that varies in a default frequency band that is wider than the frequency band during the iterative operation stage, about a default set-point frequency;

acquires initial values related to at least one electrical magnitude associated with exciting the transducer at a plurality of frequencies in the frequency band; and analyzes the initial values to determine an iterative stage set-point frequency associated with a beginning of the iterative operation stage.

The digital processor unit may be configured to sweep through the frequencies of the default frequency band. The frequencies in the default frequency band may be swept through using a step-size that is larger than that used for sweeping through the frequency band during the iterative operation stage.

During the initialization stage, the values of the electrical magnitude associated with the excitation of the transducer may be acquired for all of the frequencies of the default frequency band.

The default frequency band may have a width of at least plus or minus 3 percent on either side of the default set-point frequency.

The frequency band during the iterative operation stage may have a width of no more than plus or minus 20 percent on either side of the corresponding set-point frequency. In some embodiments, the frequency band during the iterative operation stage may have a width of not more than plus or minus 10 percent.

The frequency band during the iterative operation stage may be approximately centered on the corresponding set-point frequency.

The digital processor unit may comprise a microcontroller that is programmed to generate each excitation frequency by dividing a clock frequency of the microcontroller, among other things.

In some embodiments of the invention, the piezoelectric transducer may be configured to generate vibration for transmitting to keratinous materials.

In another of its aspects, the invention may also provide a liquid atomizer device, comprising a piezoelectric transducer configured to atomize the liquid, and a generator as described herein. In some aspects, the atomizer device may include the liquid. For example, the liquid may include a scent. In some embodiments, the liquid may be a cosmetic product including at least one of a perfume, a cologne, a body spray, and a deodorant.

The device may include a self-contained electrical power supply.

Aside from the structural arrangements set forth above, the invention could include a number of other arrangements, such as those explained hereinafter. It is to be understood that both the foregoing description and the following description are exemplary.

BRIEF DESCRIPTION OF THE DRAWINGS

The accompanying drawings, which are incorporated in and constitute a part of this specification, illustrate a number of exemplary features of a non-limiting embodiment of the invention and together with the description, serve to explain the principles of the invention. In the drawings.

MORE DETAILED DESCRIPTION

Reference will now be made in detail to exemplary embodiments of the invention, an example of which is illustrated in the accompanying drawings. Wherever possible, the same reference numbers will be used throughout the drawings to refer to the same or like parts. It is to be understood that both the foregoing general description and the following detailed description are exemplary and explanatory only and are not restrictive of the invention, as claimed.

Figure 1:
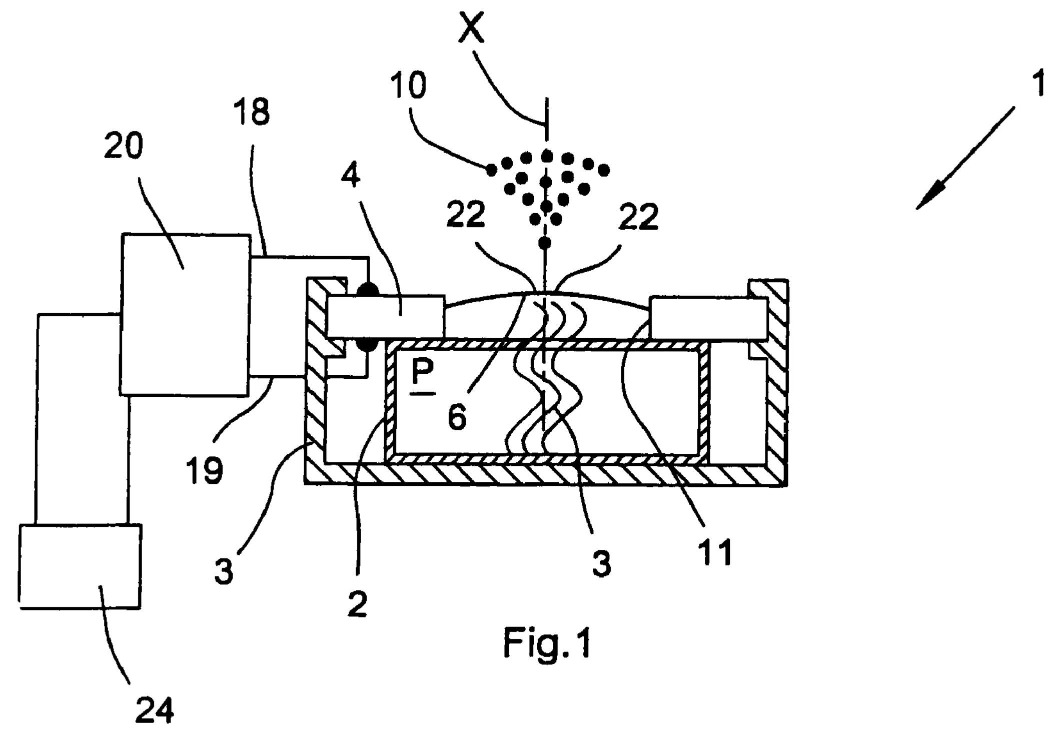
FIG. 1 is an exemplary diagrammatic view partially in axial section showing an example of an atomizer device consistent with one embodiment of the present invention.

An atomizer device 1, as shown in FIG. 1, may comprise a generator 20 and at least one reservoir containing a liquid P to be atomized, which is conveyed (e.g., fed) to a piezoelectric transducer 4. Transducer 4 may be of any known type and may be excited by generator 20 to cause a perforated diaphragm 6 to vibrate in such a manner as to form droplets 10 of liquid P (e.g., droplets that are atomized and dispensed into air in their atomized form). Generator 20 and reservoir 2 may be secured to a housing 3.

In one example, transducer 4 may comprise a ring 11 having an axis X and including a piezoelectric material, e.g., a ceramic, such as, zirconate (PZT), titanium, barium metaniobate (PN), and/or zinc oxide. Ring 11 may be a ring as sold under the reference 27121 by the Danish supplier Ferroperm, its material including a PZ27 type.

The piezoelectric material may be polarized in its thickness direction, i.e., along the axis X, so that applying a potential on its main faces by means of electrical conductors 18 and 19 connected to generator 20, may cause the ring 11 to vibrate in the radial direction, thereby tending to modify the inner diameter of the ring 11.

Because perforated diaphragm 6 may be in contact with the inner surface of ring 11 (i.e., the inner diameter), the force exerted by ring 11 may cause the perforated diaphragm 6 to become slightly dome-shaped. An alternating application of such a force may, in turn, create axial vibration at and/or near a center associated with diaphragm 6, as desired to form droplets 10.

A central region associated with diaphragm 6 may include openings 22 of size and number adapted to the size of the droplets and to the flow rate desired.

Diaphragm 6 may be fed with liquid by capillarity, for example, using a wick 3 that may dip into reservoir 2, as shown in FIG. 1, or in the manner described in U.S. Pat. No. 5,518,179 or in international application WO 00/53337.

Figure 6:
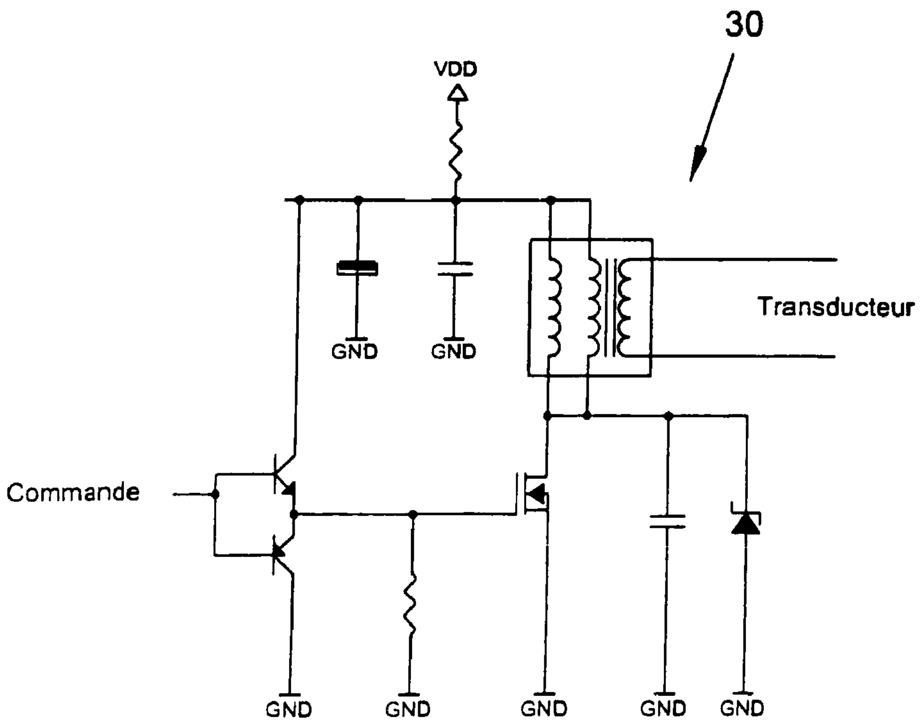
FIG. 6 is an exemplary circuit diagram of a power stage consistent with one embodiment of the present invention.
Figure 2:
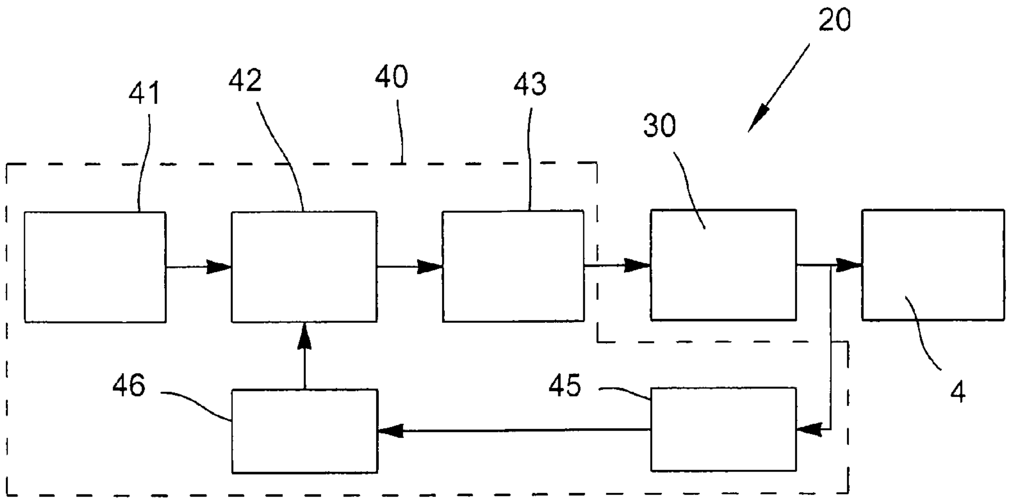
FIG. 2 is an exemplary block diagram of a generator consistent with one embodiment of the present invention.

As can be seen in FIG. 2, generator 20 may comprise a power stage 30 that delivers the excitation current to transducer 4. Power stage 30, which may be implemented as shown in the diagram of FIG. 6, may be driven by a digital processor unit 40 including at least one microcontroller, among other things.

Digital processor unit 40 may include an oscillator 41 configured to generate a clock frequency that may enable the control signal for power stage 30 to be generated by dividing the clock frequency by an integer n in a divider 42 and then shaping the resulting signal in monostable 43. For example, the clock frequency may be greater than or equal to 30 MHz. In one example, the clock frequency may be about 60 MHz. If the frequency to be generated is about 98.2 kHz, for example, then the integer n may lie in the range 580 to 640, e.g., in the range 599 to 622 during the iterative phase. The difference between two successively-generated frequencies may lie in the range 166 Hz to 155 Hz. The greater the clock frequency, the smaller the difference that may be obtained between two generated frequencies.

Digital processor unit 40 may include a measurement module 45 for measuring or otherwise acquiring values related to at least one electrical magnitude (e.g., voltage) associated with the excitation of transducer 4, and an analysis module 46 for analyzing the values as measured in this way.

In some examples, measurement module 45 may be configured to measure the voltage across the terminals of transducer 4 and may include an analog-to-digital converter (ADC) and a memory for storing the measured values and for enabling the measured values to be analyzed subsequently by analysis module 46. For example, measurement module 45 and analysis module 46 may be implemented by programming a microcontroller having a processor, a memory, and an ADC. Divider 42 may also be implemented by programming the microcontroller, and oscillator 41 may provide the clock circuit for the microcontroller. Monostable 43 also may be integrated in the microcontroller with desired programming.

Generator 20 may be powered by a self-contained electrical power supply 24, e.g., comprising a plurality of optionally-rechargeable batteries. The operation of generator 20 will now be described with reference to FIG. 3.

Figure 3:
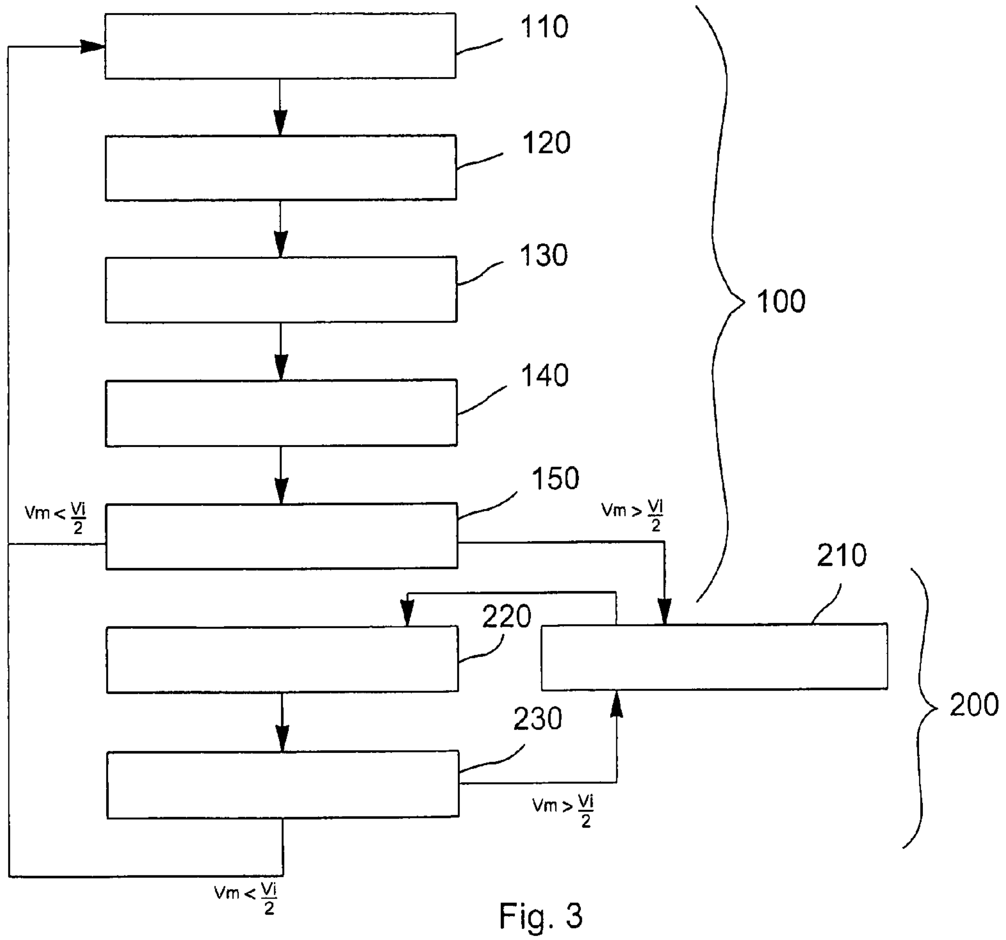
FIG. 3 is an exemplary flow chart showing the various steps in the operation of a generator consistent with one embodiment of the present invention.

FIG. 3 is an exemplary flow chart showing the various steps in the operation of the generator. Generator 20 may be configured to begin by operating in an initialization stage 100, and subsequently to operate in an iterative stage 200. Initialization stage 100 may begin with switching on generator 20 (step 110). This may occur, for example, when a user presses a pushbutton or when an activation signal is received by generator 20. The activation signal may stem from receiving an order issued by a remote control, by a computer network, and/or by reading a file or other memory device (e.g., database) containing an instruction for triggering atomization in association with predefined images and/or sounds, for example.

Step 120 may include reading default values for a set-point frequency $f_i$ and a maximum voltage $V_i$ expected across the terminals of transducer 4 (e.g., from a file, a memory, a database, or other suitable location).

During step 130, digital processor unit 40 may sweep through a band of default frequencies around the default set-point frequency $f_i$. This sweep may be performed with a relatively large step-size, e.g., about 300 Hz, from a low frequency value of about 0.9 $f_i$ up to a high frequency value of about 1.1 $f_i$. During this sweep, for each discrete frequency value $f_j$, digital processor unit 40 may record a corresponding electrical magnitude (e.g., a voltage) across the terminals of transducer 4 (e.g., from measuring module 45).

Figure 4:
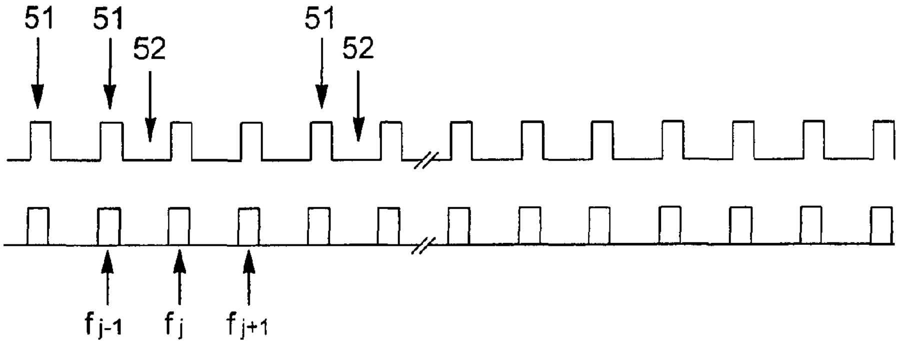
FIG. 4 shows an exemplary excitation signal delivered to the power stage of the generator consistent with one embodiment of the present invention.
Figure 5:
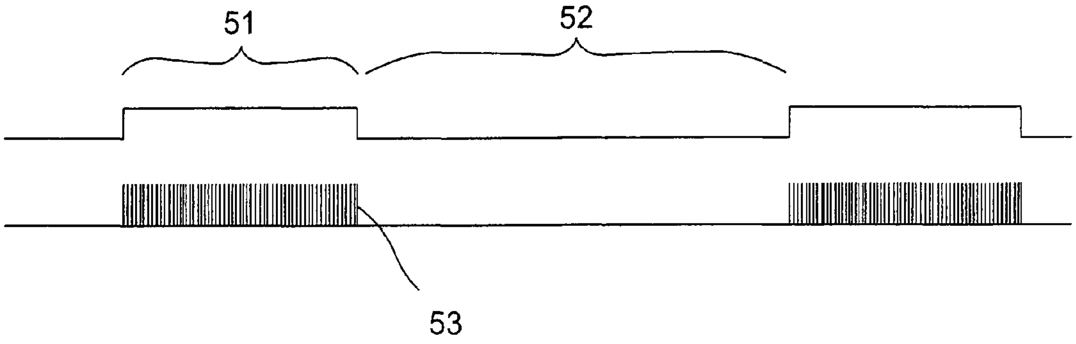
FIG. 5 shows a detail of the subject matter of FIG. 4.

A frequency sweep can be performed for each frequency $f_j$ by generating a burst of pulses of frequency $f_i$ as shown in FIG. 4, these bursts being spaced apart by idle periods 52. The duration of a burst 51 may lie in the range 10 μs to 100 ms, for example. In some examples, each burst 51 may contain the same number of pulses 53. Alternatively, each burst may contain more or fewer pulses as desired. Two bursts of pulses 53 may be separated by an idle period lying in the range 10 μs to 100 ms, for example. In one example, the duration of a burst 51 may be about 1.5 ms and that of an idle period 52 may be about 3.5 ms. The frequency $f_i$ may correspond to a particular value $n_j$ for the division ratio n.

Digital processor unit 40 may be configured to change the ratio n by which the clock frequency is divided in divider 42 during the idle period, so as to be ready to generate the next frequency. The division ratio n may be incremented by one, two, or more units, as desired, during the initial stage.

Once the frequencies have been swept through, generator 20 may determine a set-point frequency $f_m$ associated with the beginning of the iterative stage 200 (step 140). Such a determination may be made by analyzing the voltage across the terminals of transducer 4 at each excitation frequency $f_j$ in the initial stage 100, so as to select the frequency which corresponds to the maximum amplitude for the voltage across the terminals of transducer 4.

During a subsequent step 150, generator 20 may determine whether the amplitude of the voltage across the terminals of transducer 4 is greater than a threshold value. In one example, such a threshold value may be equal to $V_i/2$, where $V_i$ is the maximum voltage expected by default. If the voltage across the terminals of transducer 4 is greater than the threshold value, generator 20 may begin stage 200 of iterative operation. If the voltage across the terminals of transducer 4 is not greater than the threshold value, then generator 20 may return to step 110 to restart the initialization stage 100.

During the iterative operation stage 200, transducer 4 may be excited at a frequency $f_j$ that varies over a band of frequencies centered about the previously-determined set-point value $f_m$. This band of frequencies may extend between the set-point frequency $f_m$ minus 2 percent and the set-point frequency $f_m$ plus 2 percent.

The sweeping during iterative operation stage 200 may be performed more finely than during initialization stage 100. For example, a sweeping step-size of about 150 Hz may be utilized, with the division ratio n being decremented by unity on each iteration.

During each iteration of iterative operation stage 200, a new set-point frequency $f_m$ may be determined by analyzing the voltage values across the terminals of transducer 4 so as to take as the new set-point frequency, the frequency for which the voltage is at a maximum (step 220).

Generator 20 may determine whether a maximum amplitude of the voltage measured during the frequency sweep is greater than $V_i/2$ (step 230). If so, generator 20 may restart an iteration at step 210 with the newly determined set-point frequency value. Otherwise, generator 20 may restart initialization stage 100.

Operation during the iterative stage 200 may comprise atomization cycles comprising one or more iterations and dead periods during which transducer 4 may not be excited, e.g., a duration lying in the range of 1 ms to 5 ms between two successive cycles. This dead period may occur during step 230, for example. These dead periods may improve atomization performance, in particular by enabling the liquid P to rise in the wick 3 between two atomization cycles.

The invention is not limited to the example described above. In particular, the sweep through the frequency band during the iterative operation stage 200 may take place over a range that is wider or narrower, as desired. Further the frequency band over which the sweep takes place, both during the initial stage 100 and during the iterative stage 200 need not be centered exactly on the set-point frequency.

Additionally, a sweep through a frequency band may be undertaken by causing the frequency to increase from a low frequency to a high frequency, to decrease from a high frequency to a low frequency, to randomly generate frequencies within the band, or in any other way.

The default values $f_i$ and $V_i$ may be stored in a memory associated with generator 20 during manufacture of the atomizer device, and/or during operational testing.

The invention may be suited to use with atomizers such as those devices for dispensing scented liquids and/or cosmetic products and the like. However, the invention is not limited to an atomizer device, and generator 20 may be used with other devices that include piezoelectric transducers, such as, for example, devices configured to transmit ultrasound vibration to keratinous materials (e.g., ultrasound transducers used in appliances for assisting active agents to penetrate onto and/or into epidermis, hair, or nails). When used in conjunction with keratinous materials, a clock frequency may be higher, e.g., greater than 100 MHz, and the excitation frequency of transducer 4 may be about 1.5 MHz, for example.

Throughout the description, including the claims, the term "comprising a" should be understood as being synonymous with "comprising at least one." In addition, any range set forth in the description, including the claims should be understood as including its end value(s).

Although the present invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A generator for exciting a piezoelectric transducer, the generator comprising:

at least one digital processor unit configured to operate at least in an iterative operation stage comprising more than two successive iterations, the at least one digital processor unit also being configured so that for each iteration:

the transducer is excited at a plurality of frequencies in a frequency band about a set-point frequency, said frequency band being swept through about the set-point frequency;

one or more values related to at least one electrical magnitude associated with the excitation of the transducer for a plurality of frequencies in the frequency band are acquired; and once the frequencies have been swept through, the values acquired are analysed and a new set-point frequency is determined for a subsequent iteration.

2. The generator according to claim 1, wherein the new set-point frequency corresponds approximately to a resonant frequency of the transducer.

3. The generator according to claim 1, wherein the new set-point frequency corresponds approximately to an anti-resonant frequency of the transducer.

4. The generator according to claim 1, wherein each of the frequencies within the frequency band during an iteration is between a minimum frequency and a maximum frequency associated with the frequency band.

5. The generator according to claim 1, wherein the acquired values related to the at least one electrical magnitude include the voltage across terminals associated with the transducer.

6. The generator according to claim 1, wherein the acquired values related to the at least one electrical magnitude are analyzed at least in part during a dead period during which, the transducer is not excited.

7. The generator according to claim 1, wherein the digital processor unit is configured to generate a pulse excitation signal.

8. The generator according to claim 1, wherein the generator is configured so that during an iteration, for each frequency of the band, at least one burst of pulses at the frequency is emitted by the digital processor unit.

9. The generator according to claim 8, wherein each burst of pulses lasts for a period ranging of from 10 μs to 100 ms.

10. The generator according to claim 8, wherein two bursts of pulses are emitted and wherein the two bursts of pulses are separated by an idle period having a duration ranging from 10 μs to 100 ms.

11. The generator according to claim 8, wherein more than two bursts of pulses are emitted, each of the more than two bursts having the same number of pulses.

12. The generator according to claim 8, wherein one or more values related to at least one electrical magnitude are acquired for each pulse within each burst at the corresponding frequency.

13. The generator according to claim 1, wherein the digital processor unit is configured to determine, on each iteration, an extremum associated with the one or more values related to at least one electrical magnitude.

14. The generator according to claim 13, wherein the digital processor unit is configured to compare the determined extremum with a reference value.

15. The generator according to claim 14, wherein as a function of the result of the comparison, the digital processor unit either performs a new iteration of the iterative operation stage, or else returns to an initialization stage.

16. The generator according to claim 1, wherein the generator is configured to operate in an initial operation stage prior to operating in the iterative operation stage.

17. The generator according to claim 16, wherein the generator is configured such that during the initial operation stage, the generator:

excites the transducer at a frequency that varies in a default frequency band that is wider than the frequency band during the iterative operation stage, about a default set-point frequency;

acquires initial values related to at least one electrical magnitude associated with exciting the transducer at a plurality of frequencies in the frequency band; and analyzes the initial values to determine an iterative stage set-point frequency associated with a beginning of the iterative operation stage.

18. The generator according to claim 17, wherein the digital processor unit is configured to sweep through the frequencies of the default frequency band.

19. The generator according to claim 17, wherein the frequency variation within the frequency band during an iteration takes place as a frequency sweep between extreme frequency values of the band, the sweep through the default frequency band being performed at a frequency step-size that is greater than the frequency step-size of the sweep through the frequency band during the iterative operation stage.

20. The generator according to claim 17, wherein the default frequency band presents a width of at least 3 percent on either side of the default set-point frequency.

21. The generator according to claim 1, wherein the frequency band during the iterative operation stage presents a width of no more than 20 percent on either side of the corresponding set-point frequency.

22. The generator according to claim 1, wherein the frequency band during the iterative operation stage is centered about the corresponding set-point frequency.

23. The generator according to claim 1, wherein the digital processor unit comprises a microcontroller programmed to generate each frequency by dividing a clock frequency associated with the microcontroller.

24. A device for atomizing a liquid, the device comprising a transducer configured to atomize the liquid and a generator as defined in claim 1.

25. The device according to claim 24, further comprising a self-contained electrical power supply.

26. The device according to claim 24, further comprising the liquid, wherein the liquid includes a scent.

27. The device according to claim 24, further comprising the liquid, wherein the liquid is a cosmetic product including at least one of a perfume, a cologne, a body spray, and a deodorant.

* * * * *